US009621694B2

(12) United States Patent
Wong et al.

(10) Patent No.: US 9,621,694 B2
(45) Date of Patent: Apr. 11, 2017

(54) MOBILE WIRELESS COMMUNICATIONS DEVICE WITH SHUNT COMPONENT AND RELATED METHODS

(71) Applicant: BLACKBERRY LIMITED, Waterloo (CA)

(72) Inventors: Joshua Kwan Ho Wong, Waterloo (CA); John Alfred Whitmore, Waterloo (CA); Adrian Matthew Cooke, Kitchener (CA); Steven Eugene Downs, Irving, TX (US); Jari Kristian Van Wonterghem, Tampere (FI)

(73) Assignee: BLACKBERRY LIMITED, Waterloo (CA)

( * ) Notice: Subject to any disclaimer, the term of this patent is extended or adjusted under 35 U.S.C. 154(b) by 96 days.

(21) Appl. No.: 14/100,909

(22) Filed: Dec. 9, 2013

(65) Prior Publication Data
US 2014/0099993 A1     Apr. 10, 2014

Related U.S. Application Data

(63) Continuation of application No. 13/005,311, filed on Jan. 11, 2011, now Pat. No. 8,615,279.
(Continued)

(51) Int. Cl.
*H04M 1/00*     (2006.01)
*H04M 1/02*     (2006.01)
(Continued)

(52) U.S. Cl.
CPC .......... *H04M 1/0277* (2013.01); *H01Q 1/243* (2013.01); *H01Q 9/0442* (2013.01);
(Continued)

(58) Field of Classification Search
CPC ........................ H04M 1/0202; H04M 1/0277
(Continued)

(56) References Cited

U.S. PATENT DOCUMENTS 7,483,727 B2    1/2009    Zhu et al.
7,705,795 B2    4/2010    Chiang et al.
(Continued)

FOREIGN PATENT DOCUMENTS

EP            1693925         8/2006
KR       1020080073567        8/2008
(Continued)

OTHER PUBLICATIONS

Bennett, "The design of broad-band aircraft-antenna systems", Proceedings of the IRE, vol. 33, No. 10, Oct. 1945, pp. 671-700.
(Continued)

*Primary Examiner* — Vladimir Magloire
*Assistant Examiner* — Jaime Holliday
(74) *Attorney, Agent, or Firm* — Guntin & Gust, PLC; Atanu Das

(57) ABSTRACT

A mobile wireless communications device may include a portable housing including at least one electrically conductive housing portion configured to function as an antenna. The mobile wireless communications device may also include a printed circuit board (PCB) carried by the portable housing, and wireless transceiver circuitry carried by the PCB and including at least one circuit element carried by the PCB. The mobile wireless communications device may also include at least one current shunt component coupled between the at least one electrically conductive housing portion and the at least one circuit element.

18 Claims, 9 Drawing Sheets

Related U.S. Application Data

(60) Provisional application No. 61/367,113, filed on Jul. 23, 2010.

(51) Int. Cl.
  *H01Q 1/24* (2006.01)
  *H01Q 9/04* (2006.01)
  *H05K 13/00* (2006.01)

(52) U.S. Cl.
  CPC ........... *H01Q 9/0464* (2013.01); *H05K 13/00* (2013.01); *H04M 1/0202* (2013.01); *Y10T 29/49117* (2015.01)

(58) Field of Classification Search
  USPC ............................................ 455/575.1, 575.7
  See application file for complete search history.

(56) References Cited

U.S. PATENT DOCUMENTS

| | | | |
|---|---|---|---|
| 7,768,462 B2 | 8/2010 | Zhang et al. | |
| 7,773,038 B2 | 8/2010 | Degner et al. | |
| 7,804,453 B2 | 9/2010 | Chiang et al. | |
| 2001/0052830 A1* | 12/2001 | Noguchi | H03H 9/725 333/133 |
| 2004/0147297 A1* | 7/2004 | Mikkola et al. | 455/575.7 |
| 2008/0227506 A1 | 9/2008 | Corrigan et al. | |
| 2008/0316121 A1 | 12/2008 | Hobson et al. | |
| 2009/0115668 A1* | 5/2009 | Abe | 343/702 |
| 2009/0231210 A1* | 9/2009 | Sotoudeh | 343/702 |
| 2009/0256758 A1 | 10/2009 | Schlub et al. | |
| 2009/0273523 A1 | 11/2009 | Sakuma | |
| 2010/0123633 A1 | 5/2010 | Ozden et al. | |
| 2010/0277377 A1 | 11/2010 | Sato et al. | |
| 2010/0315389 A1 | 12/2010 | Sorrell et al. | |
| 2012/0009983 A1* | 1/2012 | Mow et al. | 455/575.7 |

FOREIGN PATENT DOCUMENTS

| | | |
|---|---|---|
| KR | 20090115063 | 11/2009 |
| KR | 20100002855 | 3/2010 |

OTHER PUBLICATIONS

Booker, "Slot aerials and their relation to complementary wire aerials (Babinel's principle)", Journal of the Institution of Electrical Engineers, vol. 93, No. 4, May 1946, pp. 620-626.

Wong, et al., "Fields in planar anisotropic transmission-line metamaterials", IEEE Transactions on Antennas and Propagation, vol, 54, No. 10, Oct. 2006, pp. 2742-2749.

\* cited by examiner

MOBILE WIRELESS COMMUNICATIONS DEVICE WITH SHUNT COMPONENT AND RELATED METHODS

TECHNICAL FIELD

The present disclosure generally relates to the field of wireless communications systems, and, more particularly, to mobile wireless communications devices and related methods.

BACKGROUND

Mobile wireless communications systems continue to grow in popularity and have become an integral part of both personal and business communications. For example, cellular telephones allow users to place and receive voice calls almost anywhere they travel. Moreover, as cellular telephone technology has increased, so too has the functionality of cellular devices and the different types of devices available to users. For example, many cellular devices now incorporate personal digital assistant (PDA) features such as calendars, address books, task lists, etc. Moreover, such multi-function devices may also allow users to wirelessly send and receive electronic mail (email) messages and access the Internet via a cellular network and/or a wireless local area network (WLAN), for example.

Even so, as the functionality of cellular communications devices continues to increase, so too does the demand for smaller devices which are easier and more convenient for users to carry. One challenge this poses for cellular device manufacturers is designing housings that cooperate with antennas to provide desired operating characteristics within the relatively limited amount of space available.

DETAILED DESCRIPTION

Figure 1:
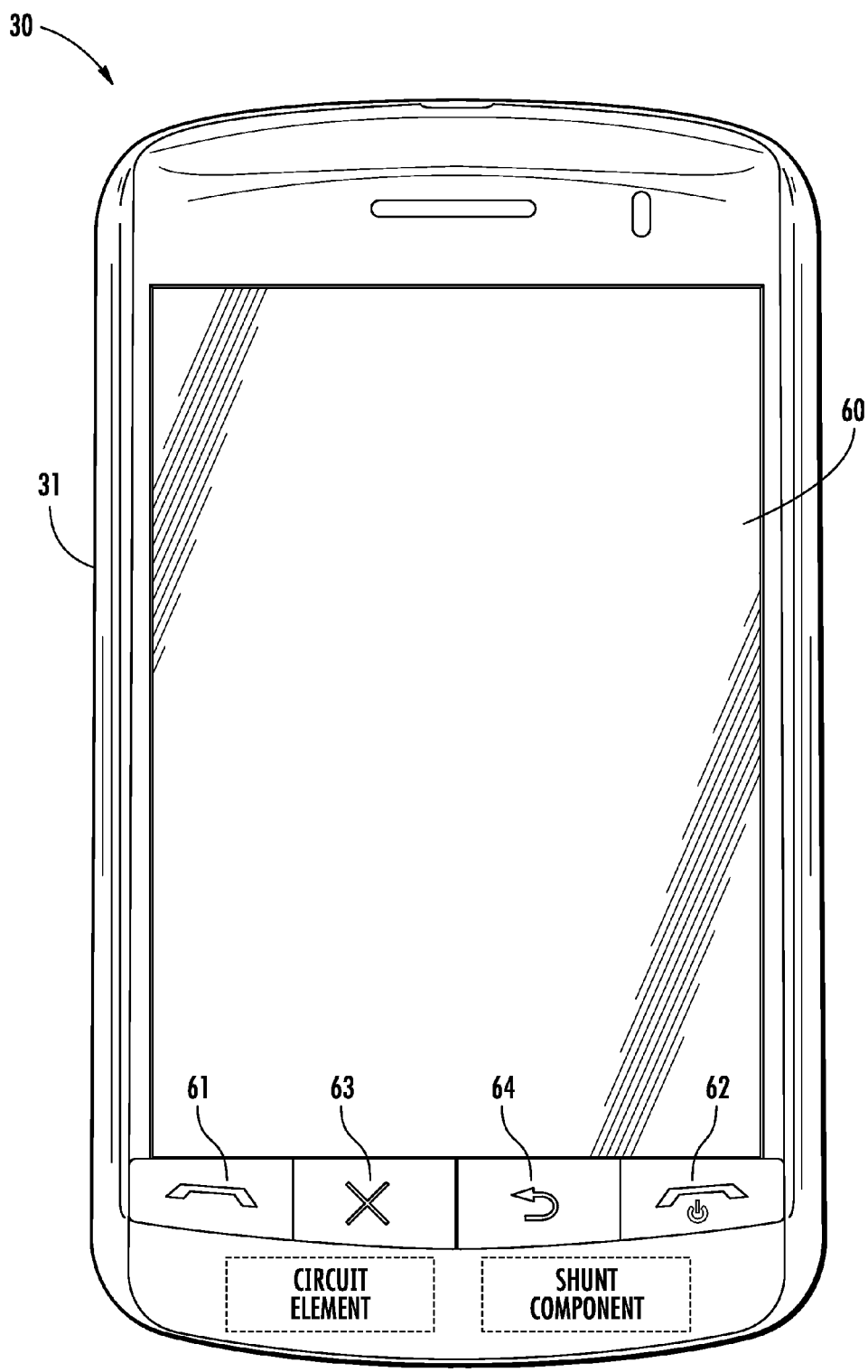
FIG. 1 is a front view of a mobile wireless communications device including a shunt conductor in accordance with one exemplary aspect.

The present description is made with reference to the accompanying drawings, in which various embodiments are shown. However, many different embodiments may be used, and thus the description should not be construed as limited to the embodiments set forth herein. Rather, these embodiments are provided so that this disclosure will be thorough and complete. Like numbers refer to like elements throughout and prime notation is used to indicate similar elements in alternative embodiments.

In accordance with one exemplary aspect, a mobile wireless communications device may include a portable housing including at least one electrically conductive housing portion configured to function as a part or as a whole of an antenna. The mobile wireless communications device may also include a printed circuit board (PCB) carried by the portable housing, and wireless transceiver circuitry including at least one circuit element carried by the PCB. The mobile wireless communications device may also include at least one current shunt component coupled between the at least one electrically conductive housing portion and the at least one circuit element. Accordingly, the mobile wireless communications device may provide an increased directional radiation pattern and reduced losses from the portable housing.

The PCB and the at least one electrically conductive portion may be positioned to define an air gap therebetween, for example. The mobile wireless communications device may further include a dielectric material body between the PCB and the at least one electrically conductive housing portion.

The at least one electrically conductive housing portion may include an electrically conductive ring along a perimeter of the portable housing, for example. The at least one current shunt component may include a plurality of current shunt components.

The at least one circuit element may include at least one conductive trace. The at least one electrically conductive portion may include at least one metallic material housing portion, for example.

The at least one circuit element may include at least one programmable circuit element. The at least one circuit element may include a plurality of impedance elements coupled together at a common node. The at least one current shunt component may be coupled to the common node, for example.

The at least one circuit element may also include at least one inductor, for example. The at least one circuit element may further include at least one capacitor.

The at least one current shunt component may also include at least one inductor. The at least one current shunt component may also include at least one capacitor, for example.

A method aspect may be directed to a method of making a mobile wireless communications device that may include a portable housing comprising at least one electrically conductive housing portion configured to function as an antenna, a printed circuit board (PCB) carried by the portable housing, and wireless transceiver circuitry carried by the PCB and including at least one circuit element carried by the PCB. The method may include coupling at least one current shunt component between the at least one electrically conductive portion and the at least one circuit element, for example.

Figure 2:
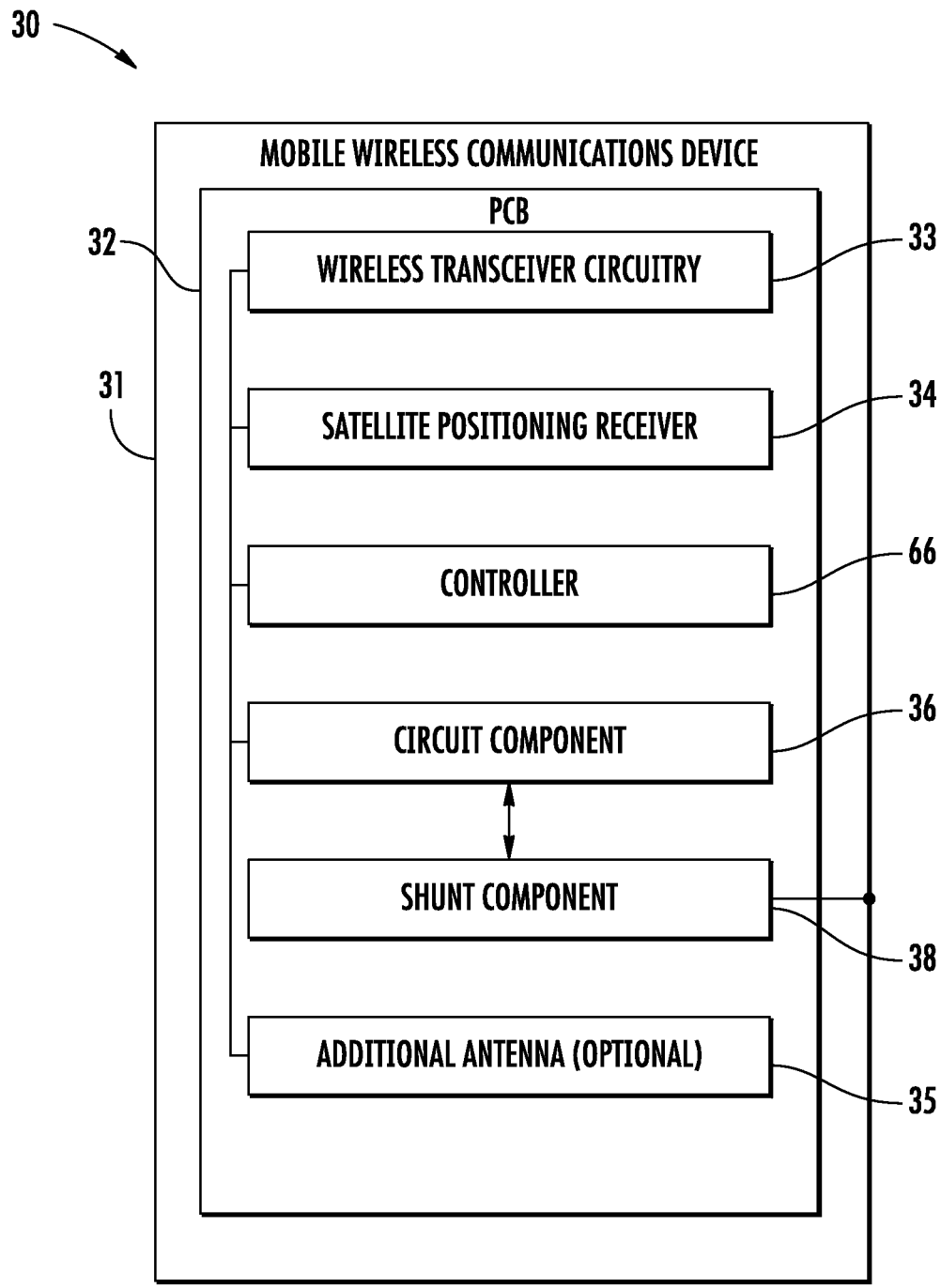
FIG. 2 is a schematic diagram of the printed circuit board (PCB) and the housing of the device of FIG. 1.

Referring initially to FIGS. 1-3, a mobile wireless communications device 30 illustratively includes a portable housing 31, a printed circuit board (PCB) 32 carried by the portable housing, and wireless transceiver circuitry 33 carried by the portable housing. In other embodiments, the PCB 32 may be used in conjunction with a metal chassis or other substrate. The PCB 32 may also include a conductive layer defining a ground plane (not shown).

A satellite positioning signal receiver 34 is also carried by the portable housing 31. The satellite positioning signal receiver 34 may be a Global Positioning System (GPS) satellite receiver, for example.

The exemplary device 30 further illustratively includes a display 60 and a plurality of control keys including an "off hook" (i.e., initiate phone call) key 61, an "on hook" (i.e., discontinue phone call) key 62, a menu key 63, and a return or escape key 64. Operation of the various device components and input keys, etc., will be described further below with reference to FIG. 9.

A controller 66 or processor may also be carried by the PCB 32. The controller 66 may cooperate with the other components, for example, the antenna 35, the satellite positioning signal receiver 34, and the wireless transceiver circuitry 33 to coordinate and control operations of the mobile wireless communications device 30. Operations may include mobile voice and data operations, including email and Internet data.

The portable housing 31 includes an electrically conductive portion. For example, the portable housing 31 may be metallic or include a metallic portion. As will be appreciated by those skilled in the art, when a portable housing 31 includes an electrically conductive portion, the electrically conductive portion functions as an antenna, and controlling the direction of current flowing the antenna becomes increasingly difficult.

The portable conductive housing 31 including the electrically conductive portion configured to operate as an antenna may transmit or receive at different operating frequencies, for example, cellular telephone, satellite, or other wireless communications frequencies. The mobile wireless communications device 30 may include an additional or second antenna 35 coupled to the wireless transceiver circuitry 33. The second antenna 35 may also be configured to transmit or receive at different operating frequencies, for example, cellular telephone, satellite, or other wireless communications frequencies, and may operate independently or in conjunction with the electrically conductive portion of the portable conductive housing 31 that is configured as an antenna.

One particularly advantageous approach to controlling the current flow includes forming a non-current carrying portion, using the portable housing 31 (configured as an antenna) and circuit elements 36 configured in an array. The circuit elements 36 may include orthogonal circuit components, for example, one or more of a capacitor and inductor. The circuit elements 36 may also include conductive traces, for example, on the PCB 32. The circuit elements 36 may be other components or elements, as will be appreciated by those skilled in the art.

Figure 3A:
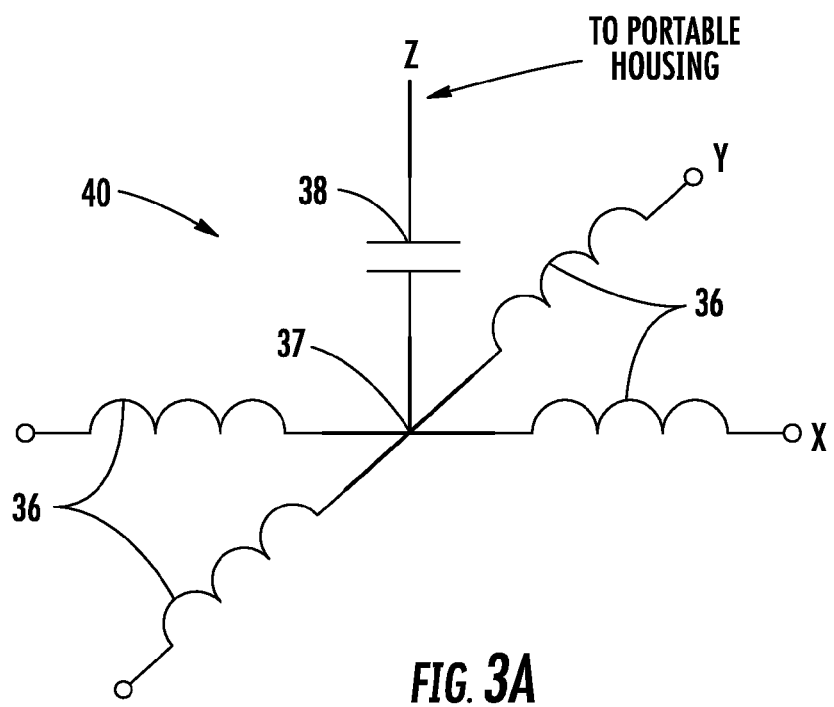
FIGS. 3a-3d are schematic diagrams of circuit elements and a shunt conductor in accordance with exemplary embodiments.
Figure 3B:
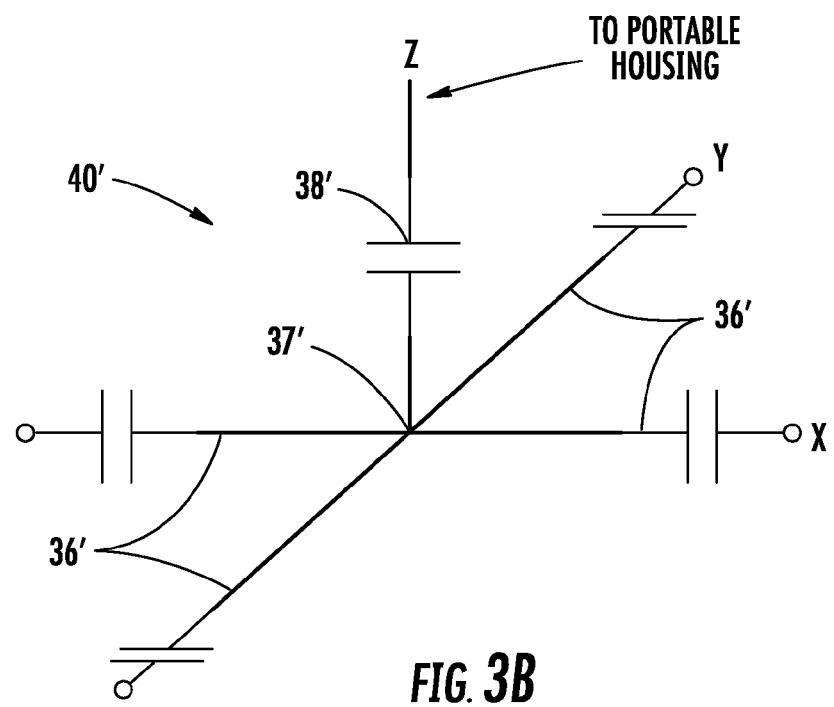
Figure 3C:
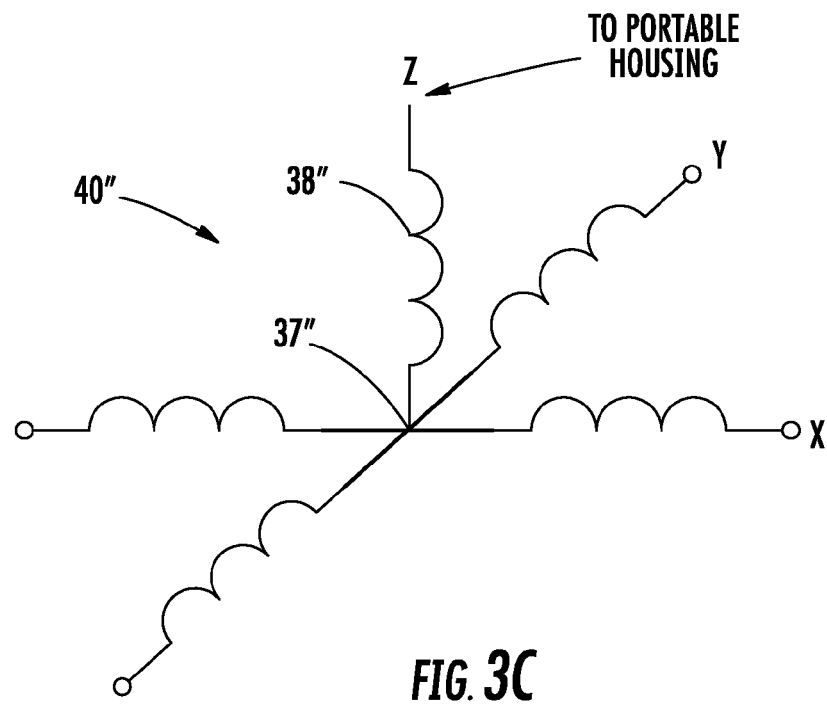
Figure 3D:
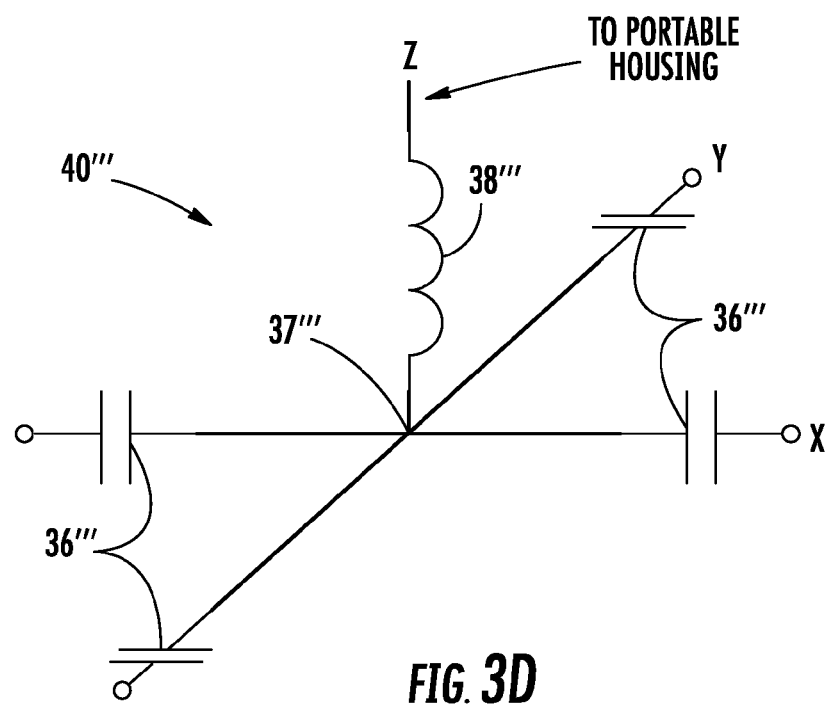

At each common node or intersection 37 of the circuit elements 36, a shunt component 38 is coupled to the portable housing 31. The intersection of four circuit elements 36 and the shunt component 38 extending from the intersection 37 form a unit cell 40. As will be appreciated by those skilled in the art, the non-current carrying portion is formed by the cooperation of the array of circuit elements 36 and a shunt component 38. In other words, unit cells 40 may be used to define a current path for the current. For example, as illustrated in FIG. 3a, a unit cell 40 configured as a passband unit cell illustratively includes four inductors as the circuit elements 36 and a capacitor as the shunt component 38. Alternatively, as illustrated in FIG. 3b, a unit cell 40' configured as a stopband unit cell illustratively includes four capacitors as the circuit elements 36' and a capacitor as the shunt component 38'. Of course, other types of circuit elements 36 and shunt conductors 38 may be used, for example, as illustrated in FIGS. 3c and 3d, and the shunt conductor may include more than one shunt conductor.

Additionally, when the spacing between adjacent circuit elements 36 is relatively much less than the desired operating wavelength, the unit cell 40 may exhibit electromagnetic characteristics that may be adjusted to desired specifications. Accordingly, unit cells 40 including the circuit elements 36 and the shunt conductor 38 may be characterized by macro quantities, such as permittivity or permeability, for example. Using the quasi-transverse electromagnetic mode (quasi-TEM) approximation within a unit cell 40, as disclosed in J. K. H. Wong, K. G. Balmain, and G. V. Eleftheriades, "Fields in planar anisotropic transmission-line metamaterials," vol. 54, no. 10, pp. 2742-2749, October 2006, the non-zero field components are:

$$\partial E_z/\partial y = j\omega\mu_{xx}H_x \tag{1a}$$

$$\partial E_z/\partial x = j\omega\mu_{yy}H_y \tag{1b}$$

$$-\partial H_x/\partial y + \partial H_y/\partial x = j\omega\epsilon_{zz}E_z. \tag{1c}$$

This configuration allows the propagation of waves where the electric fields are polarized vertically between the unit cells 40 and the portable housing 31. If the separation between the unit cells 40 and the portable housing 31 is made sufficiently small, the fields within the volume bounded by the unit cells and the portable housing is approximately uniform in the z direction. In other words, $\partial/\partial z=0$ and equations (1a-1c) apply. Considering the H-mode fields, equations (1a) and (1b) are integrated to obtain:

$$\partial V_z/\partial y = -j\omega\mu_{xx}H_x\Delta z \tag{2a}$$

$$\partial V_z/\partial x = j\omega\mu_{yy}H_y\Delta z. \tag{2b}$$

Next, equation (2) is integrated along the x and the y directions to obtain:

$$\partial V_z/\partial_y \Delta_x = -j\omega\mu_{xx}I_y\Delta z \tag{3a}$$

$$\partial V_z/\partial_x \Delta_y = j\omega\mu_{yy}I_x\Delta z. \tag{3b}$$

The currents flowing through the circuit elements 36, i.e. the capacitors and the inductors are determined by the voltage difference across a unit cell 40 and can be expressed as:

$$I_x = (1/jX_x)(\partial V_z/\partial x)(\Delta x) \tag{4a}$$

$$I_y = -(1/jX_y)(\partial V_z/\partial y)(\Delta y). \tag{4b}$$

In equations (4a-4b), $X_x$ and $X_y$ are respectively, the reactance along the x and the y directions at the wave frequency. Substituting equation (4) into equation (3) and assuming $d=\Delta x=\Delta y=\Delta z$:

$$\mu_{xx} = X_y/\omega d \tag{5a}$$

$$\mu_{yy} = X_x/\omega d \tag{5b}$$

For the unit cell 40 illustrated in FIG. 3a, the reactance along the x and the y directions are equal and can be represented as $$X_x = X_y = \omega L_0 d + \omega L \tag{6}$$

where L is the series loaded inductance and $L_0$ is the inductance per unit length of the interconnecting transmission line. Therefore, equation (6) can be substituted into equation (5) to arrive at the expressions that relate the permeabilities and the lumped component values which is:

$$\mu_{xx}=\mu_{yy}=L_0+L/d \quad (7)$$

Applying the same procedure to the Ampere's law, (1c), one would arrive at an expression relating the shunt component 38 value to the permittivity which is:

$$\epsilon_{zz}=C_0+C_{shunt}/D \quad (8)$$

where $C_{shunt}$ is the shunt capacitance and $C_0$ is the capacitance per unit length of the interconnecting transmission-line.

Having calculated the effective permittivity and the permeability, the propagation constant within the portable housing 31 and the array of circuit components 36 may be derived such that:

$$k=\omega\sqrt{(\mu\epsilon)}=\omega\sqrt{(L_0+L/d)(C_0+C/d)} \quad (9)$$

Assuming that the operating frequency is relatively well below the self-resonance frequency of the circuit components 36 (i.e., the inductors and the capacitors), equation (9) is always real. In other words, propagation is allowed for all frequencies from zero to the self-resonance frequency of the circuit components 36. Thus, the portable housing 31, the circuit elements 36 (i.e. series inductors), and the shunt component 38 cooperate to form a passband condition (FIG. 3a).

To create a stopband condition, k must be made imaginary. Accordingly, if the circuit component 36' is a capacitor as shown in FIG. 3b. we get $$X_x=X_y=\omega L_0 d-1/\omega C \quad (10)$$

Substituting equation (10) into equation (5):

$$\mu_{xx}=\mu_{yy}=L_0-1/\omega^2 Cd \quad (11)$$

Thus, propagation in such as structure is given by $$k=\omega\sqrt{(\mu\epsilon)}=\omega\sqrt{(L_0-1/\omega^2 Cd)(C_0+C/d)} \quad (12)$$

From (12), one can observe that the wave vector becomes imaginary when the following condition holds $$C<1/\omega^2 L_0 d \quad (13)$$

In other words, a stopband condition can be achieved within a desired frequency range by varying C. As will be appreciated by those skilled in the art, to create a stopband, any number or combination of circuit components may be used so long as k is imaginary. Additionally, a combination of passband unit cells 40 and stopband unit cells 40' may be configured to direct currents from the antenna 35.

Figure 4:
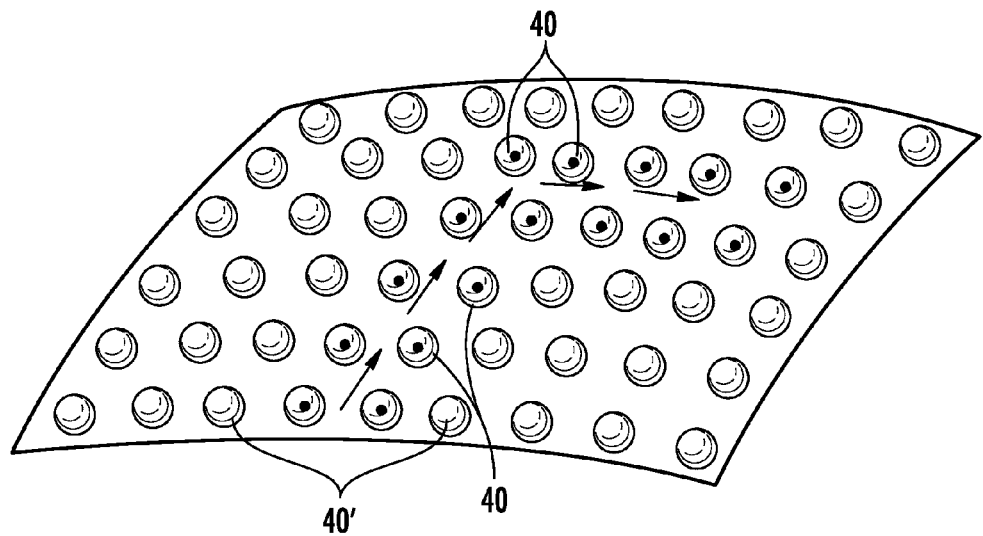
FIG. 4 is a schematic diagram of an arrangement of passband and stopband cells in accordance with an exemplary embodiment.

Referring now to FIG. 4, a combination of passband and stopband unit cells 40, 40', 40", 40''' may be arranged to direct the flow of current through the portable housing 31. When the portable housing 31 is excited with current from the antenna 35, the current will flow away from the point of excitation, but may be confined by the stopband unit cells 40' and flow in areas of the passband cells 40. Thus, as will be appreciated by those skilled in the art, antenna design in a device having a full metal portable housing may focus on the arrangement of the passband unit cells 40 into a shape and size that produces the desired radiation pattern.

However, given the relatively small size of a mobile wireless communications device 30, it may be desirable to further reduce the amount of discrete physical components used for directing the current or creating the non-current carrying portion. In other words, a mobile wireless communications device 30 including an array, or a layer, of circuit elements 36 may not be desirable, as additional components may increase the weight of the mobile wireless communications device. In such a case, the circuit elements 36 may be the circuit components carried on the PCB 32, for example, the wireless transceiver circuitry 33.

As will be appreciated by those skilled in the art, the array of spaced apart circuit components 36 and the shunt component 38 advantageously cooperate to enable radiation with a mobile wireless communications device having an electrically conductive housing. Indeed, growing industrial design trends include metallic materials, for example, to convey a sense of increased quality.

Accordingly, many mobile wireless communications devices include relatively increased quantities of metallic materials. Some of these mobile wireless communications devices also include a radiating element, or an antenna, that is integrated into a structure including the metallic materials, for example, a metal ring. In other words, the metal ring or electrically conductive material portion of the portable housing also functions as an antenna. Alternatively, in some mobile wireless communications devices, the radiating element may be positioned away from the metallic materials (e.g. metallic housing).

The circuit components 36 and the shunt component 38 advantageously enable wireless communications via an internal antenna that may be completely covered with a metallic material, for example. Indeed, as will be appreciated by those skilled in the art, a metallic material may include a material that behaves like a conductor in the radio frequency (RF) band. For example, a metallic material may include a liquid crystal display (LCD), as the glass is embedded with micro-wires that would appear as a conducting plate to an electromagnetic wave.

Figure 5:
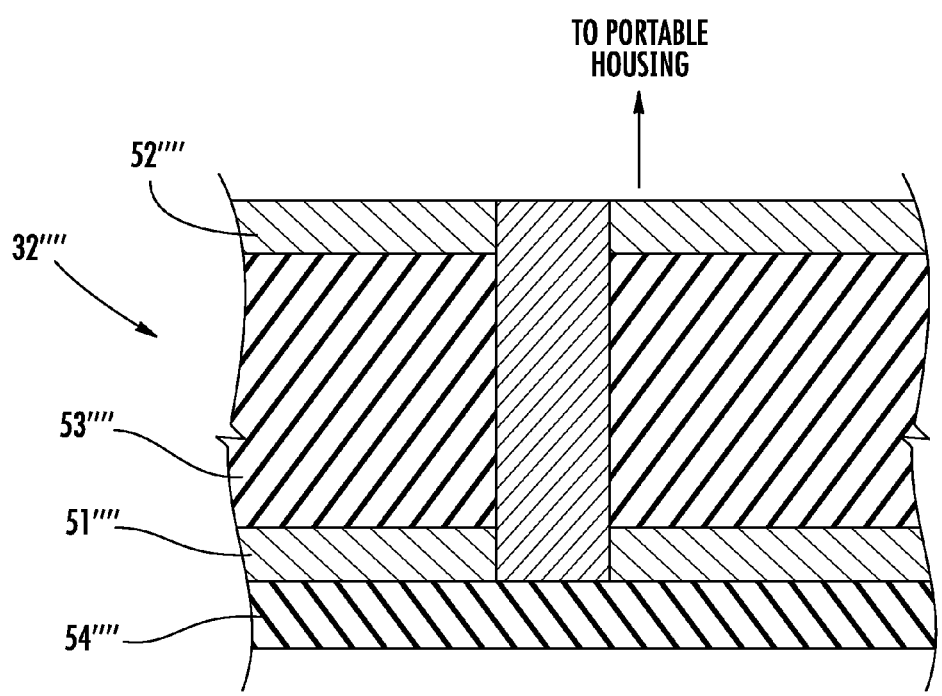
FIG. 5 is a cross-sectional diagram of a multi-layer PCB in accordance with an exemplary embodiment.

Referring now to FIG. 5, in another exemplary embodiment, the mobile wireless communications device 30"" includes a multi-layer PCB 32"" that includes a first conductive layer 51"" (i.e. the ground plane), a dielectric layer 54"", and a second conductive layer 52"" separated from the first conductive layer by a second dielectric layer 53"". The second dielectric layer 53"" may be a layer of air, or may be another dielectric material, as will be appreciated by those skilled in the art. The shunt conductor 38"" couples the first and second conductive layers 51"", 52"". The second conductive layer 51"" may include the circuit elements 36"" or conductive traces (not shown) on the PCB 32"".

Still further, in some exemplary embodiments, one or more of the circuit elements 36 may be carried by a flexible substrate (not shown). The flexible circuit substrate, which may be either attached to the PCB 32 or separate from the PCB, may carry the circuit elements 36 or include a metallization layer that acts as the circuit elements. The flexible circuit substrate may be Kapton™, for example.

A prototype mobile wireless communications device similar to the mobile wireless communications device 30 described above was made and covered with copper to emulate a completely metallic portable housing. The antenna was configured for operation at the GPS frequency of 1.575 GHz. The PCB had a plurality of shunt components configured in a semi-circular configuration and coupling the metallic portable housing to the ground plane of the PCB.

Figure 6:
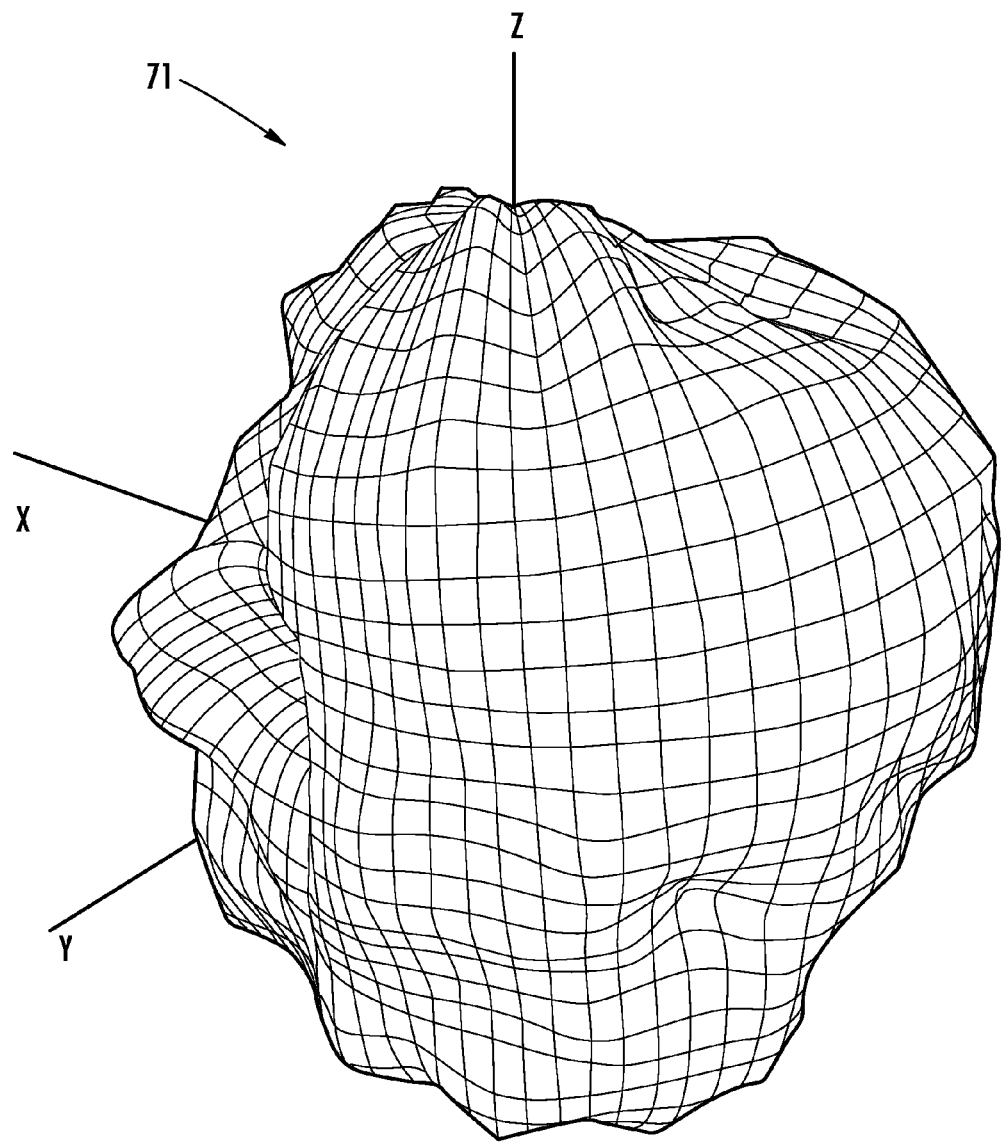
FIG. 6 is a graph of measured radiation of an antenna of a mobile wireless communication device in accordance with an exemplary embodiment.

Referring additionally to the graph 71 in FIG. 6, the measured radiation pattern of the prototype GPS antenna of the prototype is illustrated. The measured gain is roughly −7.5 dBi, which is relatively comparable with the antenna gain of other GPS antennas.

Figure 7:
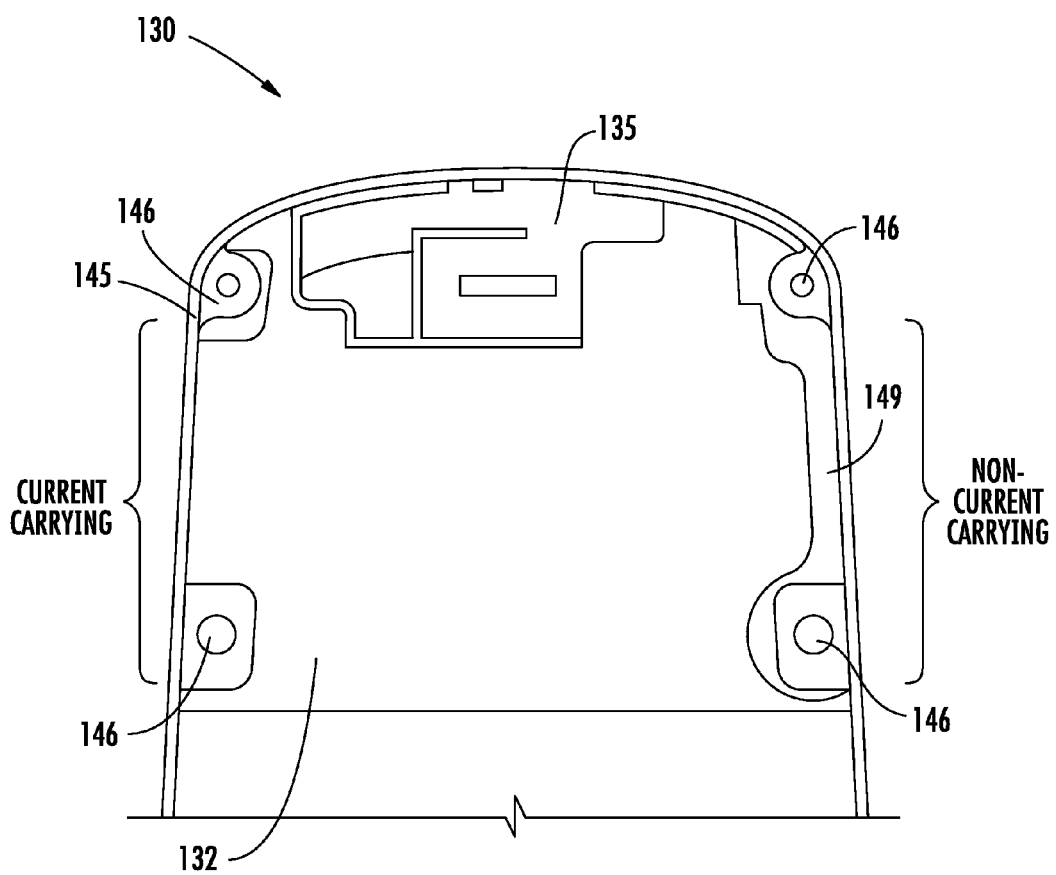
FIG. 7 is a schematic diagram of a portion of a PCB and housing of a mobile wireless communications device in accordance with an exemplary embodiment.
Figure 8:
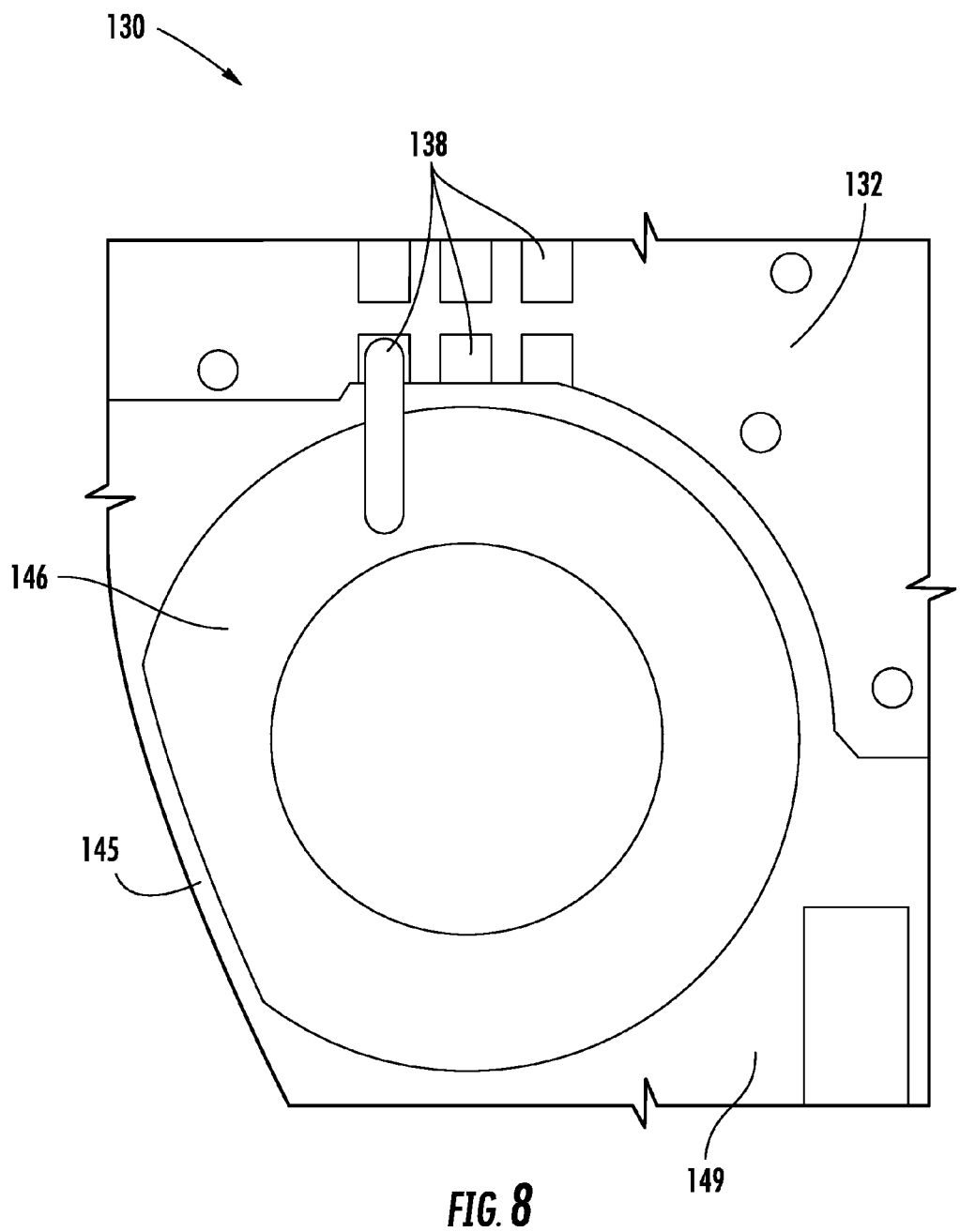
FIG. 8 is an enlarged view of a portion of the PCB and housing of FIG. 7.

Referring now to FIGS. 7-8, another embodiment of the mobile wireless communications device 130 according to an exemplary aspect is described. Illustratively, the portable housing 131 includes a metal ring 145 positioned along a perimeter of the portable housing and configured to function as a part of an antenna. The metal ring 145 causes increased degradation in radiated performance from the hand phantom condition, as will be appreciated by those skilled in the art. A relatively large magnitude of current was found to flow in the metal ring 145 where the user's hand would come into contact therewith. As such, a majority of the current or radiation was directed into the user's hand.

To reduce the current flowing on the metal ring 145 with a relatively small, if any, reduction in antenna radiation performance, a non-current carrying portion is adjacent the side of the mobile wireless communications device 130. The non-current carrying portion, is created by cooperation between the metal ring 145, the PCB 132, and the antenna feed location.

The metal ring 145 makes contact with the PCB 132 via the screw mounts 146 around the metal ring. The non-current carrying portion is achieved by isolating the screw mounts 146 near the antenna feedpoint. The non-current carrying portion length is defined by distance between the grounding points (i.e. the other three screw mounts that are not coupled to the shunt components 138) and the loading elements, or the shunt components, along the non-current carrying portion. To create the non-current carrying portion, the shunt components 138 that couple the metal ring 145 to the PCB 132 are adjusted such that the propagation constant along the metal ring becomes imaginary. Additionally, an air gap 149 is between the PCB 132 and the metal ring 145 along the non-current carrying portion.

Referring now to Tables 1 and 2, the results of two measurements performed, one with a non-current carrying portion in accordance with the present embodiments, (Table 1) and another without a non-current carrying portion (Table 2), are shown. Indeed, as will be appreciated by those skilled in the art, the measurements show that the hand-phantom performance of the non-current carrying portion implementation is an improvement across the bands with as much as 5 dB.

TABLE 1

| Band | Tx | | | Rx | | |
| --- | --- | --- | --- | --- | --- | --- |
| | L | M | H | L | M | H |
| 1800 | −10.44 | −10.23 | −10.88 | −10.98 | −10.97 | −11.61 |
| 1900 | −11.20 | −11.69 | −11.48 | −12.10 | −12.33 | −12.62 |
| 2100 | −11.83 | −12.24 | −11.96 | −11.96 | −13.38 | −15.61 |

TABLE 2

| Band | Tx | | | Rx | | |
| --- | --- | --- | --- | --- | --- | --- |
| | L | M | H | L | M | H |
| 1800 | −9.66 | −9.12 | −9.47 | −9.65 | −8.86 | −9.06 |
| 1900 | −8.90 | −9.10 | −8.23 | −8.77 | −8.23 | −8.44 |
| 2100 | −8.44 | −8.57 | −7.83 | −8.50 | −8.75 | −8.63 |

In some embodiments, not shown, the non-current carrying portion, may be programmable. In other words, the non-current carrying portion may not be limited to a fixed range of frequencies. As will be appreciated by those skilled in the art, the shunt components 38 allow fine-tuning of the wave vector. Accordingly, the shunt components 38 may be replaced by a programmable network device, such as may be available from Murata Manufacturing, Co. Ltd. of Japan, or Epcos AG of Germany.

In contrast to the mobile wireless communications device described herein, the iPhone™ 4G, for example, which also uses its inherent structural metal band as a radiating element, uses a broken structure as a radiating element or antenna. Indeed, the metal ring 145 of the present embodiments encompasses the entire perimeter of the mobile wireless communications device 130, and there are no cuts or parting lines in the metal ring. Accordingly, the integrity of the portable housing 131 remains intact.

Moreover, the iPhone™ 4G uses a broken structure band as its radiating element, and is tuned to several frequencies. In contrast, in the present embodiments, a portion of the structure is responsible for radiation. This is achieved by reducing the two-dimensional (2D) non-current carrying portion approach into a one-dimensional (1D) form.

Existing approaches for wirelessly communicating using a mobile wireless communications device having a full metal housing or enclosure were developed for aircrafts, missiles, land/naval armored vehicles, or radar systems, for example, as disclosed by F. D. Bennett, P. D. Coleman, and A. S. Meier in, "The design of broadband aircraft-antenna systems," Proceedings of I.R.E., pp. 671-700, October 1954, and by H. G. Booker in "Slot aerials and their relation to complementary wire aerials (Babinet's principle)," *Journal of I.E.E.*, no. 93, p. 620, 1946. These approaches employed either slots (magnetic currents) or external antennas for controlling the radiation pattern. Magnetic currents can be created by slots or an aperture in a conductive plate. This method is relatively more difficult to implement in a mobile wireless communications device, as the slot length is restricted by the device size and the industrial design requirements.

Furthermore, in a mobile wireless communications device environment, a PCB may act like a ground plane, where the propagating power is trapped by the parallel-plate TEM mode that degrades the overall radiation efficiency. Alternatively, an external antenna may be used; however, this would be contrary to the current industrial design trend, where it is desirable that all antennas be internal to the device housing.

A method aspect is directed to a method of making a mobile wireless communications device 30 that includes a portable housing 31 including at least one electrically conductive housing portion configured to function as an antenna, a printed circuit board (PCB) 32 carried by the portable housing, and wireless transceiver circuitry 33 carried by the PCB and including at least one circuit element 36 carried by the PCB. The method includes coupling at least one current shunt component 38 between the at least one electrically conductive portion 31 and the at least one circuit element 36.

Exemplary components that may be used in various embodiments of the above-described mobile wireless communications device are now described with reference to an exemplary mobile wireless communications device 1000 shown in FIG. 9. The device 1000 illustratively includes a housing 1200, a keypad 1400 and an output device 1600. The output device shown is a display 1600, which may comprise a full graphic LCD. In some embodiments, display 1600 may comprise a touch-sensitive input and output device. Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400 by the user. In some embodiments, keypad 1400 may comprise a physical keypad or a virtual keypad (e.g., using a touch-sensitive interface) or both.

The housing 1200 may be elongated vertically, or may take on other sizes and shapes (including clamshell housing structures, for example). The keypad 1400 may include a mode selection key, or other hardware or software for switching between text entry and telephony entry.

Figure 9:
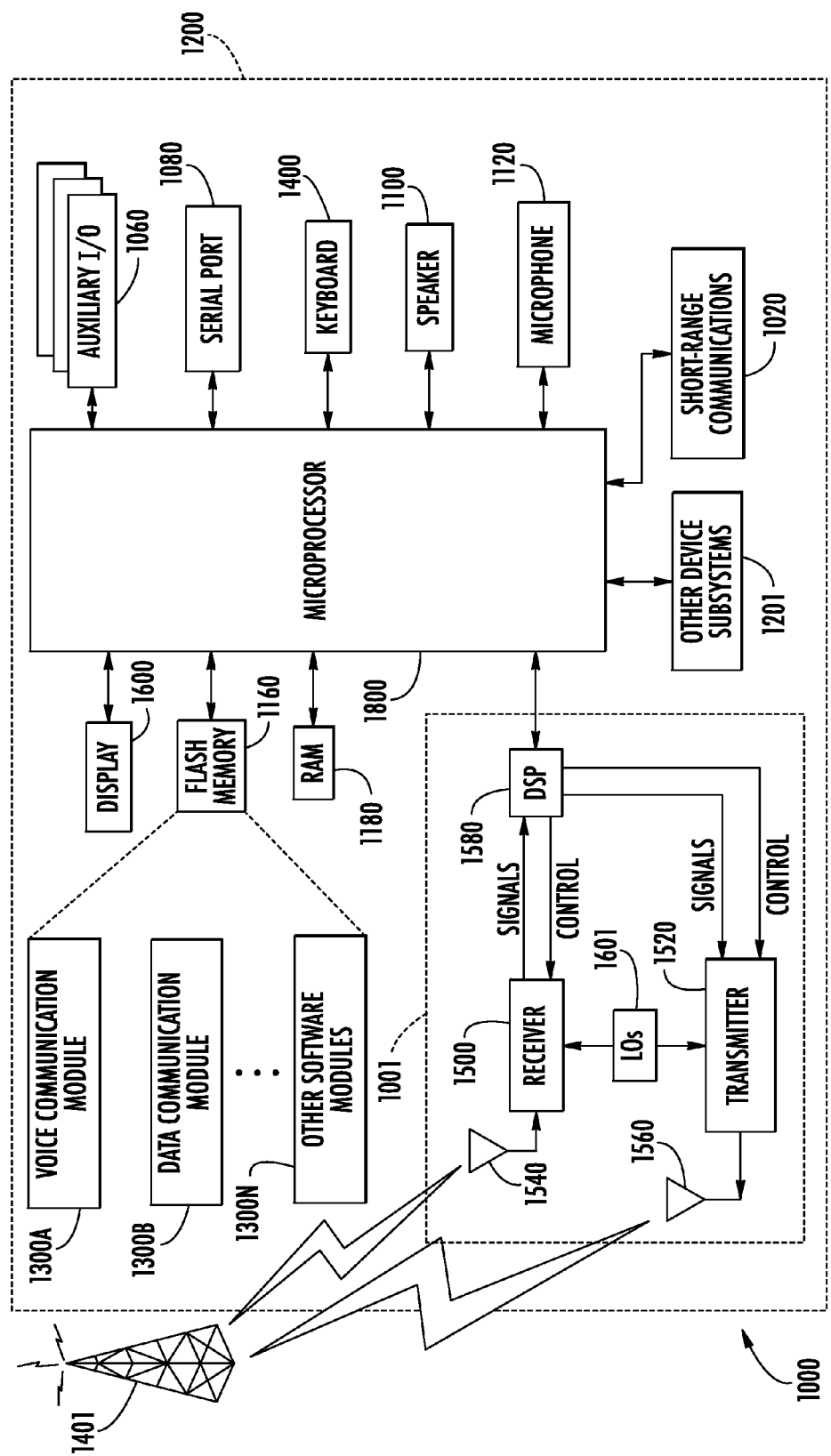
FIG. 9 is a schematic block diagram illustrating additional components that may be included in the mobile wireless communications device of FIG. 1.

In addition to the processing device 1800, other parts of the mobile device 1000 are shown schematically in FIG. 9. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having voice and data communications capabilities. In addition, the mobile device 1000 may have the capability to communicate with other computer systems via the Internet.

Operating system software executed by the processing device 1800 may be stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications or modules 1300A-1300N on the device 1000, such as software modules for performing various steps or operations. A predetermined set of applications that control basic device operations, such as data and voice communications 1300A and 1300B, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with the device user's corresponding data items stored or associated with a host computer system.

Communication functions, including data and voice communications, are performed through the communications subsystem 1001, and possibly through the short-range communications subsystem. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the Mobitex™, Data TAC™ or General Packet Radio Service (GPRS) mobile data communications networks, and also designed to operate with any of a variety of voice communications networks, such as AMPS, TDMA, CDMA, WCDMA, PCS, GSM, EDGE, etc. Other types of data and voice networks, both separate and integrated, may also be utilized with the mobile device 1000. The mobile device 1000 may also be compliant with other communications standards such as GSM, 3G, UMTS, 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber, or user of a device. A GPRS device therefore utilizes a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device user may also compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem 1020 may include an infrared device and associated circuits and components, near-field communication (NFC), or a Bluetooth™ communications module to provide for communication with similarly-enabled systems and devices.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included.

That which is claimed is:

1. An electronic device comprising:
a housing comprising an electrically conductive continuous closed ring around a periphery thereof;
wireless transceiver circuitry carried by said housing and comprising a plurality of circuit elements; and
a plurality of current shunt components carried by said housing, each of the plurality of current shunt components being electrically coupled between said electrically conductive continuous closed ring and a common node of a group of circuit elements of said plurality of circuit elements to define a plurality of unit cells, the plurality of unit cells comprising passband unit cells and stopband unit cells that are arranged to cause said electrically conductive continuous closed ring to have at least one current carrying portion and at least one non-current carrying portion, wherein each of the plurality of unit cells comprises a subset of the plurality of circuit elements and one of the plurality of current shunt components that are positioned orthogonal to each other along an X, Y and Z axis, respectively.

2. The electronic device according to claim 1, further comprising a printed circuit board (PCB) carried by said housing and mounting said wireless transceiver circuitry; and wherein said PCB and said electrically conductive closed ring are positioned to define an air gap therebetween.

3. The electronic device according to claim 2, further comprising a dielectric material body between said PCB and said electrically conductive continuous closed ring, wherein a size of a separation between the plurality of unit cells and the housing causes the generated electric field to be uniform along the Z axis between the plurality of unit cells and the housing.

4. The electronic device according to claim 1, wherein said plurality of circuit elements comprises at least one conductive trace on said PCB, and wherein adjacent circuit elements of the plurality of unit cells have a spacing that causes a generated electric field to be polarized vertically between the plurality of unit cells and the housing.

5. The electronic device according to claim 1, wherein said electrically conductive continuous closed ring comprises at least one metallic material portion.

6. The electronic device according to claim 1, wherein said plurality of circuit elements comprises at least one programmable circuit element.

7. The electronic device according to claim 1, wherein the group of circuit elements are all capacitors or are all inductors.

8. The electronic device according to claim 7, wherein the group of circuit elements comprise four inductors.

9. The electronic device according to claim 7, wherein the group of circuit elements comprise four capacitors.

10. The electronic device according to claim 1, wherein said plurality of current shunt components comprises at least one inductor.

11. The electronic device according to claim 1, wherein said plurality of current shunt components comprises at least one capacitor.

12. An electronic device comprising:
an electrically conductive continuous closed ring;
wireless transceiver circuitry comprising a plurality of circuit elements; and
a plurality of current shunt components electrically that are each coupled between said electrically conductive continuous closed ring and a common node of a group of circuit elements of said plurality of circuit elements to define a plurality of unit cells, the plurality of unit cells comprising passband unit cells and stopband unit cells that are arranged to cause said electrically conductive continuous closed ring to have at least one current carrying portion and at least one non-current carrying portion, wherein adjacent circuit elements of the plurality of unit cells have a spacing that causes a generated electric field to be polarized vertically between the plurality of unit cells and a housing.

13. The electronic device according to claim 12, further comprising a printed circuit board (PCB) mounting said wireless transceiver circuitry; and wherein said PCB and said electrically conductive closed ring are positioned to define an air gap therebetween.

14. The electronic device according to claim 12, wherein said plurality of circuit elements comprises at least one conductive trace on said PCB, and wherein a size of a separation between the plurality of unit cells and the housing causes the generated electric field to be uniform along a Z axis between the plurality of unit cells and the housing.

15. The electronic device according to claim 12, wherein said plurality of circuit elements comprises at least one programmable circuit element.

16. The electronic device according to claim 12, wherein the group of circuit elements are all capacitors or are all inductors.

17. The electronic device according to claim 12, said plurality of circuit elements comprises at least one of an inductor and a capacitor.

18. The electronic device according to claim 12, wherein said plurality of current shunt components comprises at least one of an inductor and a capacitor.

* * * * *